United States Patent [19]

Dias et al.

[11] Patent Number: 4,510,584
[45] Date of Patent: Apr. 9, 1985

[54] MOS RANDOM ACCESS MEMORY CELL WITH NONVOLATILE STORAGE

[75] Inventors: Donald R. Dias, Carrollton; Daniel C. Guterman; Robert J. Proebsting, both of Plano; Horst Leuschner, Lewisville, all of Tex.

[73] Assignee: Mostek Corporation, Carrollton, Tex.

[21] Appl. No.: 454,418

[22] Filed: Dec. 29, 1982

[51] Int. Cl.³ .............................................. G11C 11/40
[52] U.S. Cl. ..................................... 365/203; 365/189
[58] Field of Search ........................ 365/203, 182, 189

[56] References Cited

U.S. PATENT DOCUMENTS 4,475,178 10/1984 Kinoshita ........................... 365/203

Primary Examiner—Terrell W. Fears

[57] ABSTRACT

A nonvolatile random access memory cell (10) includes a static random access memory circuit and a corresponding nonvolatile memory circuit. The volatile memory circuit operates in a conventional manner and has first and second data states. Upon receipt of a store command signal a charge storage node is driven to either a first or a second charge state, depending upon the data state in the volatile memory circuit. For one charge state the charge storage signal is gated through a transistor (64) and a capacitor (68) to a floating gate node (44). Charge is transferred to and from the floating gate node (44) through current tunneling elements (48,50) which comprise a dielectric fabricated on a monocrystalline substrate. For the recall operation a recall command signal is applied to a transistor (52) which couples a transistor (42) to the $\overline{\text{DATA}}$ node (22) of the volatile memory circuit. If a positive charge state has been stored at the charge storage node (44) the transistor (42) is rendered conductive to pull the $\overline{\text{DATA}}$ node (22) to ground to restore the data state to the volatile memory circuit. If a negative charge state has been stored at the charge storage node (44) there is no load applied to either the DATA node (20) or the $\overline{\text{DATA}}$ node (22). The cross-couple transistors, (12,14) are fabricated to have different lengths such that the node (22) is driven to a high voltage state whenever a default condition is encountered, thereby restoring the original data state to the volatile memory circuit.

37 Claims, 3 Drawing Figures

MOS RANDOM ACCESS MEMORY CELL WITH NONVOLATILE STORAGE

TECHNICAL FIELD

The present application pertains in general to MOS memory circuits and more particularly to such circuits which are nonvolatile.

BACKGROUND OF THE INVENTION

Semiconductor memory circuits are used in many applications to store data. Most read-write memory circuits are volatile, that is, the data state stored in the memory circuit is lost when power is removed from the circuit. Thus, a system which has a completely volatile memory will lose all the data stored in the memory if power is temporarily lost from the system. In many applications the possibility of losing stored data from a volatile memory is a serious handicap. For certain applications the critical data can be protected from loss by the use of electrically programmable read only memories or by transferring the data into a nonvolatile storage medium such as magnetic disk or tape. But in many applications there are rapid and frequent changes in the state of the data such that it is extremely difficult to save the data in the event that circuit power is lost. To meet this problem there have been developed memory cells which combine a standard volatile memory circuit together with a nonvolatile memory element. Such a circuit is shown in U.S. Pat. No. 4,128,773. These circuits operate in the usual manner for conventional operation, but upon command the data state in the volatile element is shifted into the nonvolatile element. The power for the circuit can then be removed for an extended period of time. After the power is restored, the data state in the nonvolatile circuit is transferred into the volatile circuit element to return the system to the original data state condition.

Although the combination of volatile and nonvolatile memory circuits, also referred to as a "shadow RAM cell," have functioned successfully, the need for extensive circuitry substantially reduces the data density for a memory system. Therefore, in view of the requirements for nonvolatile backup and maximum memory density, there exists a need for a nonvolatile random access memory cell which can reliably store and recall data while having a minimum area configuration or have increased margin and reliability with a similar area as compared to prior art devices.

SUMMARY OF THE INVENTION

A selected embodiment of the present invention comprises a nonvolatile memory cell which includes a volatile memory circuit having first and second data nodes which are driven to opposite first and second data states. The memory cell further includes a nonvolatile memory circuit which has therein a charge storage circuit having a first transistor having a floating gate wherein a first or a second charge state can be stored on the floating gate, a first current tunneling element connected between a third node and the floating gate and a second circuit tunneling element connected between the floating gate and the power terminal. The nonvolatile memory circuit further includes circuitry which is responsive to the volatile memory circuit for applying a store command signal across the first tunneling element to produce the first charge state at the floating gate when the volatile memory circuit is in the first data state. The nonvolatile memory circuit still further includes transistor circuitry which is responsive to the store command signal for gating the store command signal to the floating gate for applying a voltage across the second current tunneling element to produce the second charge state at the floating gate when the volatile memory circuit is in the second data state. Upon receipt of a recall signal the volatile memory circuit returns to one of said data states as a default condition and returns to the other of said data states in response to a drive signal applied from the nonvolatile memory circuit to one of the data nodes of the volatile memory circuit.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
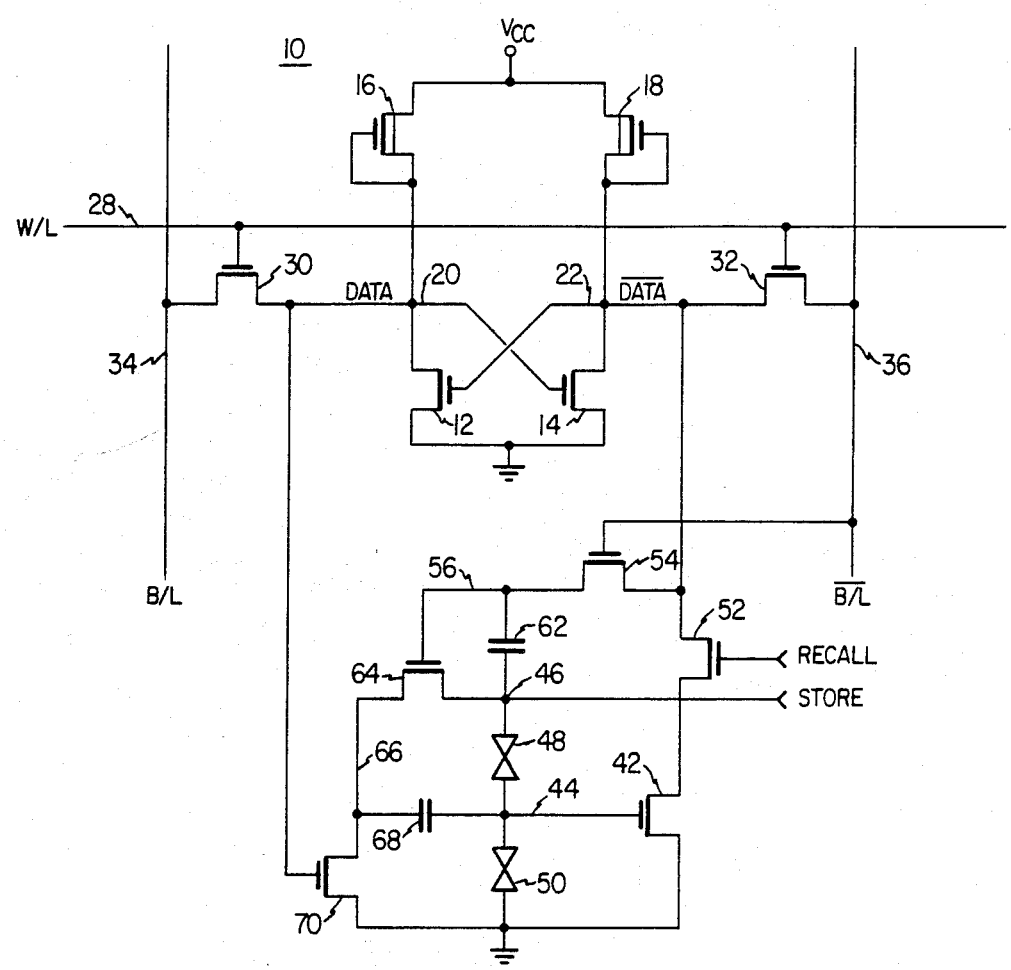
FIG. 1 is a schematic illustration of a nonvolatile random access memory cell having a volatile memory storage circuit and a nonvolatile memory storage circuit in accordance with the present invention.

A nonvolatile random access memory cell 10 based on N-channel technology is illustrated in FIG. 1. This cell has both a volatile memory circuit and a nonvolatile memory circuit. The volatile memory circuit includes enhancement transistors 12 and 14 together with depletion transistors 16 and 18. Transistors 12 and 12 have the source terminals thereof tied together and connected to a common ground power terminal. The drain of transistor 12 is connected to a DATA node 20 which is also connected to the gate terminal of transistor 14. The drain terminal of transistor 14 is connected to a $\overline{\text{DATA}}$ node 22 which is also connected to the gate terminal of transistor 12. The transistors 12 and 14 are cross-coupled such that the nodes 20 and 22 are driven to opposite voltage states. In a selected embodiment of the invention, the transistor 12 has a shorter channel length than transistor 14.

The drain terminals of the transistors 16 and 18 are connected together to a common power terminal, $V_{cc}$, which is typically 5.0 volts. The source terminals of transistors 16 and 18 are respectively connected to the nodes 20 and 22. The gate terminal for each of the transistors 16 and 18 is connected to the corresponding source terminal thereof. The transistors 16 and 18 function as high impedance loads for the transistors 12 and 14.

The memory cell 10 is selected by applying a voltage state of approximately 5.0 volts to a word line 28. The word line 28 is connected to the gate terminals of transistors 30 and 32. The source and drain terminals of transistor 30 are connected between a bit line 34 and the node 20. The source and drain terminals of transistor 32 are connected between the node 22 and a complement bit line 36. Data states are transferred to and from the nodes 20 and 22 by transmission through the transistors 30 and 32 to bit line 34 and complement bit line 36. The bit lines 34 and 36 are driven to complementary voltage states by the memory cell 10 during read and by external circuitry during write.

The remaining portion of the cell 10 comprises the nonvolatile memory circuit. A transistor 42 has a dielectrically isolated floating gate terminal which comprises a charge storage node 44. The source terminal of transistor 42 is connected to a ground power terminal.

A store command signal is input to a node 46. The store command signal is preferably a ramped signal having an amplitude of approximately 20 volts. A current tunneling element 48 is connected between nodes 44 and 46. The element 48 is essentially a thin oxide layer or other high integrity dielectric having a thickness of approximately 100 angstroms. The element 48 utilizes the Fowler-Nordheim tunneling mechanism. Upon the application of a sufficient voltage (approximately 12 volts) across the element 48, there is produced a current through the element. This does not produce a breakdown of the oxide layer. When the voltage across the element 48 is reduced below the conduction level, the element 48 becomes a high impedance. A second current tunneling element 50 is connected between the node 44 and the ground power terminal. The element 50 is similar to the current tunneling element 48.

The preferred embodiment for the current tunneling elements 48 and 50 is a silicon dioxide layer fabricated on a monocrystalline substrate with a polysilicon layer fabricated on the surface of the silicon dioxide layer. This is in contrast to tunneling elements which have a silicon dioxide layer fabricated between two layers of polysilicon. It has been found that the preferred approach for a current tunneling element provides more consistent tunneling characteristics from batch to batch in manufacturing.

A transistor 52 has the drain terminal thereof connected to the node 22, the source terminal thereof connected to the drain terminal of transistor 42 and the gate terminal thereof connected to receive a recall command signal which is typically a pulse having an amplitude of 5.0 volts.

A transistor 54 has the source and drain terminals thereof connected between node 22 and a node 56. The gate terminal of transistor 54 is connected to the complement bit line 36. Optionally the gate terminal of transistor 54 is connected to either the power terminal $V_{cc}$ or to the inverse of the recall signal input to the gate terminal of transistor 52.

A capacitor 62 is connected between the nodes 46 and 56.

A transistor 64 has the drain and source terminals thereof connected between node 46 and a node 66. The gate terminal of transistor 64 is connected to the node 56.

A dominant coupling capacitor 68 is connected between the charge storage node 44 and the node 66.

A transistor 70 has the drain terminal thereof connected to node 66 and the source terminal thereof connected to the ground power terminal. The gate terminal of transistor 70 is connected to the node 20.

Operation of the nonvolatile RAM cell 10 is now described with reference to FIG. 1. The volatile portion of the memory cell 10 has first and second data states. In a first data state the DATA node 20 is high and the $\overline{\text{DATA}}$ node 22 is low. In a second data state the DATA node 20 is low and the $\overline{\text{DATA}}$ node 22 is high. In the routine operation of the memory circuit which includes the cell 10, the word line 28 is activated to select the cell 10. In a write operation the data is input differentially through bit lines 34 and 36 and passed through the transistors 30 and 32 to drive the nodes 20 and 22 to the corresponding voltage states. This serves to set the state of the cross-coupled transistors 12 and 14 in the volatile memory circuit. In a read operation the word line 28 is activated to turn on the transistors 30 and 32. The voltage state at the nodes 20 and 22 are then propagated differentially to the bit lines 34 and 36. This is the conventional operation for a static RAM memory cell and this operation is not affected by the addition of the nonvolatile portion of the memory cell 10 when the recall signal is at 0 volts.

The operation of the store and recall for each of the two data states is now described. In a first example assume that the node 20 is high and the node 22 is low. The voltage state at node 20 drives transistor 70 to a conductive state which serves to pull node 66 to ground. An activation signal, a pulse having an amplitude of approximately 5 volts, is transmitted through the complement bit line 36 to turn on the transistor 54. Or, as noted above, the activation signal could be received from the power terminal $V_{cc}$ or the inverse signal of the recall signal. This pulls the node 56 to a low voltage state, thereby turning off the transistor 64. Next, the store command signal, a single pulse having a leading edge which is ramped, is input through the node 46. Since transistor 64 is off, the nodes 46 and 66 are isolated from each other with transistor 70 holding node 66 at ground, capacitor 68 tries to hold node 44 at ground. The relatively high voltage of the store command signal is developed across the element 48 which conducts heavily whenever the voltage across it exceeds about 12 volts. This causes a current flow therethrough producing a net positive charge at the charge storage node 44. When the voltage at the node 46 drops, the element 48 becomes a high impedance, thereby isolating the charge at node 44. The charge at node 44 is now isolated since the capacitor 68, element 50 and the gate of transistor 42 all conduct essentially no current at low voltage. If power is now removed from the cell 10, the data state stored in the volatile portion of the cell, at nodes 20 and 22, will be lost. However, the positive charge on the charge storage node 44 will be maintained for an extended period of time.

The recall operation proceeds as follows. A recall command signal is input to the transistor 52 to connect the node 22 to the transistor 42. Since a positive voltage state was previously stored on the node 44, the transistor 42 will be rendered conductive, thereby pulling node 22 to ground. As the supply voltage $V_{cc}$ is ramped from 0 to 5 volts, the node 22 will be held at ground while node 20 rises to approximately 5 volts, thereby reestablishing the original data state in the volatile portion of the memory cell 10. Note that this occurs even if transistors 12 and 14 differ substantially in size.

In a second store operation example assume that the node 20 is at a low voltage state and the node 22 is at a high voltage state. The low voltage state at node 20 maintains transistor 70 turned off thereby isolating node 66 from ground. An activation signal is transmitted through the complement bit line 36 to render the transistor 54 conductive. This serves to connect node 22 to node 56. Since node 22 is at a high voltage state, the node 56 will be precharged to a high voltage state. Next, the store command ramped signal pulse is input to node 46 where it is coupled through the capacitor 62 to boost the voltage at node 56. This boost in voltage is great enough that node 56 remains at least one transistor threshold ($V_T$) of transistor 64 above the node 66 voltage which results in the full amplitude of the store command signal being provided to the node 66. When the store command voltage reaches node 66, it is coupled through capacitor 68 to elevate the voltage at node 44. This voltage will be substantially developed across the current tunneling element 50. The voltage across element 50 produces a current flow of electrons therethrough to the floating gate which limits the voltage on node 44 to only about +12 volts while the voltage on node 66 is ramped to about 20 volts. When the store command signal then returns to ground, node 66 returns to ground and the negative voltage change of 20 volts on node 66 causes a negative voltage change of more than 12 volts on node 44 due to the capacitor 68. This results in a negative voltage on node 44 when the store command signal has dropped from its high to 0 voltage level. If power is then removed from the cell 10, the data state in the volatile portion will be lost but the negative charge state produced at the node 44 will be maintained.

In the recall operation the recall command signal is applied to the transistor 52 to render the transistor conductive. However, the negative voltage state at the node 44 will hold the transistor 42 off, thereby isolating node 22 from the circuit ground. Thus, in this condition the nonvolatile portion of the cell 10 does not provide an affirmative drive, as $V_{cc}$ is ramped from 0 to 5 volts, to set the state of the volatile memory circuit portion of the memory cell. However, as noted above, the cross-coupled transistors 12 and 14 are fabricated to have different geometries such that the nodes 20 and 22 are driven to a default state whenever there is no drive applied externally to the nodes 20 and 22. In a preferred embodiment of the present invention the transistor 12 is fabricated to have a shorter channel length than transistor 14. This gives transistor 12 a lower threshold and higher gain as compared to the corresponding parameters of transistor 14 and applies a smaller capacitance on the node 22 than that of node 20. These factors combine to ensure that, as $V_{cc}$ is ramped from 0 to 5 volts, node 22 will reach the threshold of transistor 12 before node 20 reaches the threshold voltage of transistor 14. The conduction of transistor 12 ideally keeps node 20 from ever reaching the threshold voltage of transistor 14. Thus, node 22 will be driven to a high state and node 20 will be driven to a low state. Thus, the original data state condition is restored to the volatile portion of the memory cell 10.

During the store operation the transistor 54 is subjected to a large drain-to-source voltage such that it is susceptible to leakage current. The method to avoid this leakage current is to bring the activation signal on complement bit line 36 to an intermediate voltage, approximately $V_{cc}/2$, after the charging of node 56 but before receipt of the store command signal. This would also apply if the gate terminal of transistor 54 were connected to receive the inverse of the recall signal. This intermediate voltage is low enough to avoid leakage current through transistor 54 when $\overline{DATA}$ node (22) is high and node 56 is very high. Yet it is high enough to keep transistor 54 turned on for maintaining node 56 low when $\overline{DATA}$ (node 22) is low.

The circuit of the present invention is particularly advantageous in the operation of storing a negative charge at node 44. The store command signal is gated directly to the node 66 without loss of amplitude such as would occur if the store command signal were coupled from node 46 through a capacitor to node 66. The full voltage at node 66 applies a greater voltage to the node 44 to produce tunneling current for a longer portion of the store transition. Thus, there is a more effective utilization of the store command signal. Stating this another way, since there is no voltage drop across transistor 64, the full voltage swing of the store command signal at node 46 is received at node 66. Since node 44 was limited to +12.0 volts by tunneling element 50, a large negative voltage swing on node 66 produces a large negative voltage on the storage node 44.

Figure 2:
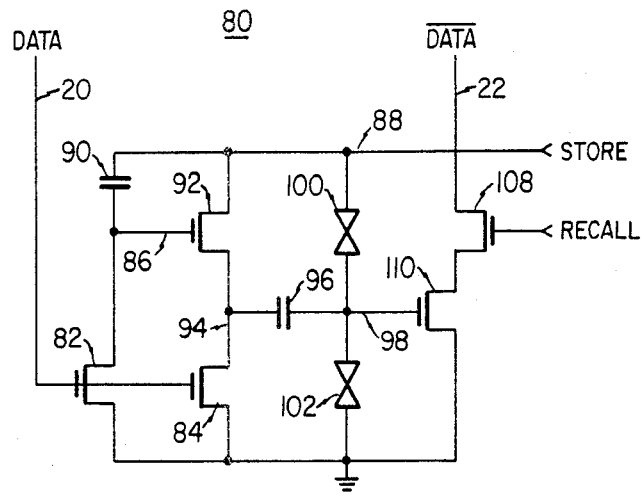
FIG. 2 is a first alternate embodiment for the nonvolatile memory storage circuit shown in FIG. 1.

A first alternate nonvolatile memory circuit for use with the present invention is illustrated in FIG. 2. A nonvolatile memory circuit 80 can be substituted in place of the nonvolatile memory circuit portion of the circuit 10 shown in FIG. 1. The DATA node 20 is connected to the gate terminals of transistors 82 and 84. The source terminals of the transistors 82 and 84 are connected to the circuit ground. The drain terminal of transistor 82 is connected to a node 86. The store signal, described above, is input to a node 88. A capacitor 90 is connected between nodes 86 and 88.

A transistor 92 has its source terminal connected to a node 94 which is in turn connected to the drain terminal of transistor 84. The gate terminal of transistor 92 is connected to node 86 and its drain terminal is connected to node 88.

A capacitor 96 is connected between node 94 and a floating gate node 98. A current tunneling element 100 is connected between nodes 88 and 98 and a current tunneling element 102 is connected between node 98 and the circuit ground. A transistor 108 has the drain terminal thereof connected to the $\overline{DATA}$ node 22 and the gate terminal thereof connected to receive the recall signal. A transistor 110 has the drain terminal thereof connected to the source terminal of transistor 108, the gate terminal thereof connected to floating gate node 98 and the source terminal thereof connected to the circuit ground.

Operation of the nonvolatile memory circuit 80 is now described in reference to FIG. 2. When node 20 is high and node 22 is low the transistors 82 and 84 are turned on pulling nodes 86 and 94 to ground. This in turn causes transistor 92 to be turned off. The ramped store signal is received at node 88 and the store signal voltage is applied across the tunneling element 100 since transistor 92 is off and nodes 86 and 94 are at ground. While the store signal is at a high voltage state there is produced a net positive charge at the floating gate node 98, the voltage on node 98 being approximately the peak voltage on the store command signal, 20 volts, less the 12.0 volt tunneling threshold of element 100, leaving about +8.0 volts on node 98. The subsequent recall of the data state from the nonvolatile memory circuit 80 of the circuit 10 to the volatile memory section is the same as described above for the storage of a net positive charge at the floating gate node 44.

When the node 20 is at a low state and the node 22 is at a high state, the transistors 82 and 84 are turned off. The store signal is ramped to a high voltage state and this high voltage is coupled across capacitor 90 to node 86 to turn on transistor 92 thereby pulling node 94 to essentially the high voltage level of the store signal less the threshold voltage of transistor 92. The high voltage level at node 94 is coupled across capacitor 96 to the floating gate node 98. With a high voltage level at node 98, as well as at node 88, there is essentially no net voltage developed across the current tunneling element 100. However, there is a substantial voltage developed across the current tunneling element 102. The voltage across element 102 causes charge to be transferred between node 98 and the ground terminal of the circuit 80, element 102 limiting the voltage on node 98 to about +12.0 volts. This results in a net negative charge stored on the floating gate node 98 when the store command signal fails. The subsequent recall of the nonvolatile memory cell 80 when a net negative charge is stored at the floating gate 98 is the same as described above for circuit 10.

Figure 3:
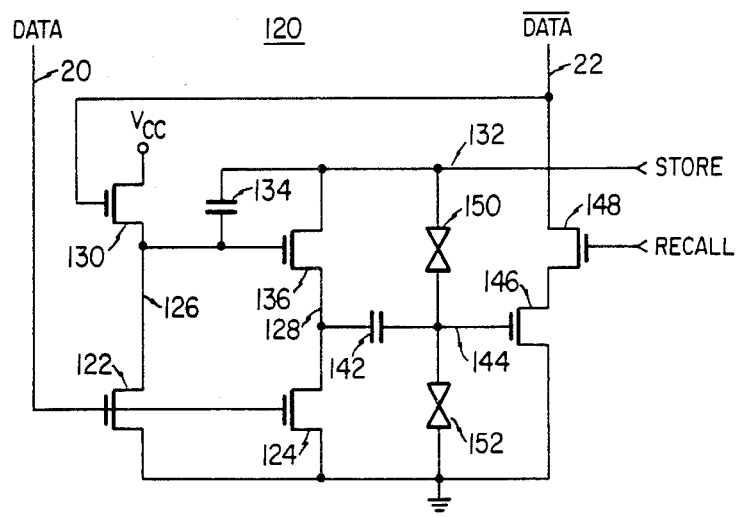
FIG. 3 is a second alternate embodiment for the nonvolatile memory storage circuit shown in FIG. 1.

A second alternate embodiment of the nonvolatile memory section of the memory cell 10 is shown in FIG. 3. A nonvolatile memory circuit 120 includes transistors 122 and 124 which have the gate terminals thereof connected to the DATA node 20. The source terminals of transistors 122 and 124 are connected to the circuit ground. The drain terminal of transistor 122 is connected to a node 126 and the drain terminal of transistor 124 is connected to a node 128. A transistor 130 has the gate terminal thereof connected to the $\overline{\text{DATA}}$ node 22, the drain node thereof connected to the power terminal $V_{cc}$ and the source terminal thereof connected to the node 126. The store command signal is input to a node 132. A capacitor 134 is connected between nodes 126 and 132. A transistor 136 has the drain terminal thereof connected to node 132, the gate terminal thereof connected to node 126 and the source terminal thereof connected to node 128.

A capacitor 142 is connected between node 128 and a floating gate node 144. The node 144 comprises a floating gate for a transistor 146. The source terminal of transistor 146 is connected to the circuit ground. A transistor 148 has the gate terminal thereof connected to receive the recall signal, the drain terminal thereof connected to the $\overline{\text{DATA}}$ node 22 and the source terminal thereof connected to the drain terminal of transistor 146. A current tunneling element 150 is connected between nodes 132 and the floating gate node 144. A current tunneling element 152 is connected between the floating gate node 144 and the circuit ground.

The operation of the circuit 120 is now described in reference to FIG. 3. When the DATA node 20 is high and the $\overline{\text{DATA}}$ node 22 is low, transistors 122 and 124 are turned on pulling nodes 126 and 128 to ground. The resulting low voltage state at node 126 turns off transistor 136. When the store command signal provided to node 132 is ramped to a high voltage state, node 128 remains at ground potential and capacitor 142 tries to keep node 144 at ground. However, as the voltage at node 132 exceeds the voltage on the floating gate node 144 by 12.0 volts, substantial conduction occurs through tunneling element 150 maintaining node 144 not more than 12.0 volts below node 132. With a peak voltage of 20.0 volts for the store command signal at node 132, node 144 is charged to about +8.0 volts. When the store command signal returns to a low voltage state, the current conduction terminates and the charge is retained on the floating gate node 144. The subsequent recall of the nonvolatile memory cell 120 is carried out in the same method as described above in FIG. 1 for the memory cell 10.

When the DATA node 20 is low and the $\overline{\text{DATA}}$ node 22 is high, the transistors 122 and 124 are turned off. Transistor 130 is turned on thereby precharging node 126 to $V_{cc}-V_t$. When the store command signal input to node 132 is ramped to a high voltage state, there will be a capacitive boosting of the voltage at node 126. The voltage at node 126 applies sufficient drive to the transistor 136 to pass essentially the full amplitude of the store command signal from node 132 to node 128. The change in voltage at node 128 will be coupled through capacitor 142 to boost the voltage at the floating gate node 144. There will thus be developed a voltage across the current tunneling element 152 to produce a current flow between the floating gate node 144 and the circuit ground, the voltage on node 144 being limited to about 12.0 volts. When the store command signal then transitions from +20.0 volts to 0.0 volts, this causes a negative 20 volt change at node 128 which in turn causes a voltage drop on node 144 of more than 12.0 volts. This serves to produce a net negative charge at the floating gate node 144 and this charge will be retained when the store signal drops from its high voltage state. The subsequent recall for circuit 120 having this net negative charge is carried out in the same manner as described above for the memory cell 10 in FIG. 1.

The alternate nonvolatile memory cell circuits 80 and 120 shown in FIGS. 2 and 3 operate in essentially a similar manner to the nonvolatile section of the memory cell 10 shown in FIG. 1. However, the circuits 80 and 120 have the possibility of improved layout to reduce the area required for an integrated circuit.

The more effective operation of the circuit of the present invention, particularly in applying a negative charge to the node 44, makes it possible to fabricate the components of the nonvolatile memory circuit to have a substantially smaller area than corresponding circuits in the prior art. This reduction in area in turn leads to a greater memory density for the overall memory circuit.

The present invention has been described in reference to N-channel technology, however, equivalent circuits can be produced using P-channel technology as well as CMOS.

In summary, the present invention comprises a nonvolatile random access memory cell having a conventional volatile memory circuit which operates together with a nonvolatile memory circuit. The nonvolatile memory circuit selectively applies first and second charge states to a charge storage node dependent upon the data state of the nonvolatile memory circuit. In response to a recall command, the nonvolatile memory circuit serves to either affirmatively set the state of the volatile memory circuit or permits the volatile memory circuit to go to a predetermined default state.

Although several embodiments of the invention have been illustrated in the accompanying Drawings and described in the foregoing Detailed Description, it will be understood that the invention is not limited to the embodiments disclosed, but is capable of numerous rearrangements, modifications and substitutions of parts and elements without departing from the scope of the invention.

We claim:
1. A nonvolatile memory cell, comprising:
a volatile memory circuit having first and second data nodes which are driven to opposite first and second data states,
a nonvolatile memory circuit comprising;
a charge storage circuit including a first transistor having a floating gate wherein a first or a second charge state can be stored on said floating gate, a first current tunneling element connected between a third node and said floating gate, a second current tunneling element connected between said floating gate and a power terminal and a capacitor connected between said floating gate and a fourth node, said floating gate transistor coupled to one of said first or second data nodes, and a second transistor connected between said third node and said fourth node for selectively gating a store command signal from said third node to said floating gate for producing one of said charge states at said floating gate.

2. A nonvolatile memory cell as recited in claim 1 wherein said volatile memory circuit comprises first and second cross-coupled transistors which drive said data nodes to said opposite data states, said first and second cross-coupled transistors fabricated to have differing electrical characteristics to drive said first and second data nodes to a selected one of said data states in the absence of an external drive applied to said first and second nodes.

3. A nonvolatile memory cell as recited in claim 1 wherein each of said current tunneling elements comprises a dielectric layer fabricated on a monocrystalline substrate.

4. A nonvolatile memory cell as recited in claim 1 wherein said second transistor has the drain terminal thereof connected to receive said store command signal and the source terminal thereof coupled to said fourth node and said nonvolatile memory cell includes a second capacitor connected between the gate and drain terminals of said second transistor wherein said store command signal capacitively boosts the voltage at the gate terminal of said second transistor.

5. A nonvolatile memory cell as recited in claim 1 including a third transistor having the gate terminal thereof connected to one of said first or second data nodes, the drain terminal thereof connected to said fourth node and the source terminal thereof connected to a power terminal of said memory cell.

6. A nonvolatile memory circuit as recited in claim 1 including means for precharging the gate terminal of said second transistor prior to receipt of said store command signal.

7. A nonvolatile memory circuit as recited in claim 6 wherein said means for precharging comprises a third transistor having the source and drain terminals thereof connected between the gate terminal of said second transistor and one of said data nodes and has the gate terminal thereof connected to a bit line which transfers data states to and from said memory cell.

8. A nonvolatile memory cell as recited in claim 6 wherein said means for precharging comprises a third transistor having the drain terminal thereof connected to a power terminal for said memory cell, the source terminal thereof connected to said fourth node and the gate terminal thereof connected to one of said data nodes.

9. A nonvolatile memory cell as recited in claim 1 including a third transistor having the source terminal thereof coupled to the drain terminal of said first transistor, the drain terminal thereof coupled to a selected one of said first or second data nodes and the gate terminal thereof connected to receive a recall signal for connecting said first transistor to a selected one of said first or second data nodes for driving said volatile memory circuit to a predetermined one of said data states when said floating gate has been charged to a predetermined one of said charge states.

10. A nonvolatile memory cell as recited in claim 9 wherein said volatile memory circuit comprises thrid and fourth cross-coupled transistors which drive said first and second data nodes to said opposite first and second data states, said third and fourth cross-coupled transistors having differing electrical characteristics for driving said third and fourth nodes to predetermined ones of said data states when said nonvolatile circuit does not apply a driving condition to one of said third or fourth nodes.

11. A nonvolatile memory cell as recited in claim 10 wherein each of said current tunneling elements comprises a dielectric layer fabricated on a monocrystalline substrate.

12. A nonvolatile memory cell as recited in claim 9 wherein each of said current tunneling elements comprises a dielectric layer fabricated on a monocrystalline substrate.

13. A nonvolatile memory cell as recited in claim 1 wherein each of said current tunneling elements comprises a dielectric layer fabricated on a monocrystalline substrate.

14. A nonvolatile memory cell, comprising:
a volatile memory circuit having first and second data nodes which are driven to opposite first and second data states,
a nonvolatile memory circuit comprising:
 a charge storage circuit including a first transistor having a floating gate wherein a first or a second charge state can be stored on said floating gate, a first current tunneling element connected between a third node and said floating gate, a second current tunneling element connected between said floating gate and a power terminal and a capacitor connected between said floating gate and a fourth node,
means for selectively coupling a store command signal from said third node to said fourth node, and
means for connecting one of said first or second data nodes through said first transistor to a power terminal in response to a recall signal for driving said volatile memory circuit to a selected one of said data states when a predetermined one of said charge states is stored on said floating gate.

15. A nonvolatile memory cell as recited in claim 14 wherein said volatile memory circuit comprises first and second cross-coupled transistors which drive said first and second data nodes to said opposite data states, said first and second cross-coupled transistors fabricated to have differing electrical characteristics to drive said first and second data nodes to a selected one of said data states in the absence of an external drive applied to said first and second data nodes.

16. A nonvolatile memory cell as recited in claim 15 where each of said current tunneling elements comprises a dielectric layer fabricated on a monocrystalline substrate.

17. A nonvolatile memory cell as recited in claim 14 wherein each of said current tunneling elements comprises a dielectric layer fabricated on a monocrystalline substrate.

18. A nonvolatile memory cell, comprising:
a nonvolatile memory circuit comprising:
 a charge storage circuit including a first transistor having a floating gate wherein a first or a second charge state can be stored on said floating gate, a first current tunneling element connected between a first node and said floating gate, a second current tunneling element connected between said floating gate and a power terminal and a capacitor connected between said floating gate and a second node, said first transistor coupled to one of said first or second data nodes, means for selectively coupling a store command signal from said first node to said second node, and a volatile memory circuit having first and second cross-coupled transistors which drive third and fourth nodes to opposite data states, said cross-coupled transistors having differing electrical characteristics for driving said third and fourth nodes to predetermined ones of said data states when said nonvolatile memory circuit does not apply a driving condition to one of said first or second nodes.

19. A nonvolatile memory cell as recited in claim 18 wherein each of said current tunneling elements comprises a dielectric layer fabricated on a monocrystalline substrate.

20. A nonvolatile memory cell, comprising:

a volatile memory circuit having first and second data nodes which are driven to opposite first and second data states, a nonvolatile memory circuit comprising:

a charge storage circuit including a first transistor having a floating gate wherein a first or a second charge state can be stored on said floating gate, a first current tunneling element connected between a third node and said floating gate, a second current tunneling element connected between said floating gate and a power terminal and a capacitor connected between said floating gate and a fourth node, said first transistor selectively coupled to one of said first or second data nodes, said current tunneling elements comprising a dielectric fabricated on a monocrystalline substrate, and means for selectively coupling a store command signal from said third node to said fourth node for charging said floating gate to a predetermined one of said charge states.

21. A nonvolatile memory cell, comprising:

a volatile memory circuit having first and second data nodes which are driven to opposite data states, a nonvolatile memory circuit comprising:

a third node for receiving a store command signal, a first transistor having a floating gate, a first current tunneling element connected between said third node and said floating gate, a second current tunneling element connected between said floating gate and a power terminal, a fourth node, a capacitor connected between said floating gate and said fourth node, means connected to at least one of said first or second data nodes for coupling said fourth node to a selected power terminal when said volatile memory circuit is in said first data state for applying said store command signal across said first current tunneling element to charge said floating gate to a first charge state, and for isolating said fourth node from said selected power terminal when said volatile memory circuit is in said second data state, and transistor means for gating essentially the full amplitude of said store command signal from said third node to said fourth node for storing a second charge state on said floating gate by current conduction through said second current tunneling element.

22. A nonvolatile memory cell as recited in claim 21 including means responsive to a recall signal for coupling said first transistor to at least one of said first or second data nodes.

23. A nonvolatile random access memory cell, comprising:

a volatile memory circuit having first and second data states, a nonvolatile memory circuit comprising:

(a) a first transistor having a floating gate, having the source terminal thereof connected to a fixed voltage node and having the drain terminal thereof coupled to said nonvolatile memory circuit, (b) a first node for receiving a store command signal, (c) a second node, (d) a first capacitor connected between said second node and said floating gate, (e) means for coupling said store command signal to said second node when said volatile memory circuit is in said second data state and for isolating said store command signal from said second node when said volatile memory circuit is in said first data state, (f) means for clamping said second node to a predetermined voltage state when said volatile memory circuit is in said first data state, (g) means connected to said first node, said floating gate and a fixed voltage terminal for charging said floating gate to a first charge state upon receipt of said store command signal when said volatile memory circuit is in said first data state and for charging said floating gate to a second charge state upon receipt of said store command signal when said volatile memory circuit is in said second data state, and (h) means connected to said transistor for driving said volatile memory circuit to a predetermined one of said data states upon receipt of a recall command signal when said floating gate has been charged to a predetermined one of said charge states.

24. A nonvolatile random access memory cell as recited in claim 23 wherein said volatile memory circuit has an unbalance condition to set said volatile memory circuit to other than said predetermined one of said data states upon application of power to said nonvolatile random access memory cell when said floating gate has been charged to other than said predetermined one of said charge states.

25. A nonvolatile random access memory cell as recited in claim 23 wherein said volatile memory circuit has first and second data nodes which are driven to opposite states and said means for gating comprises:

a second transistor having the source and drain terminals thereof connected between said first node and said second node, a second capacitor connected between said first node and the gate terminal of said second transistor, and a third transistor having the source and drain terminals thereof connected between one of said data nodes and the gate terminal of said second transistor and having the gate terminal thereof connected to receive an activation signal.

26. A nonvolatile random access memory cell as recited in claim 23 wherein said volatile memory circuit has first and second data nodes which are driven to opposite states and wherein said means for clamping comprises a second transistor having the source and drain terminals thereof connected between said second node and a fixed voltage node and having the gate terminal thereof connected to one of said data nodes of said volatile memory circuit.

27. A nonvolatile random access memory cell as recited in claim 23 wherein said means for charging said floating gate comprises:
a first current tunneling element connected between said first node and said floating gate, and
a second current tunneling element connected between said floating gate and a fixed voltage node.

28. A nonvolatile random access memory cell as recited in claim 23 wherein said nonvolatile memory circuit has first and second data nodes which are driven to opposite states and said means for driving comprises a second transistor having the source terminal thereof connected to the drain terminal of said first transistor, having the drain terminal thereof connected to one of said data nodes and having the gate terminal thereof connected to receive said recall command signal.

29. A nonvolatile random access memory cell comprising:
first and second power terminals,
a volatile memory circuit having first and second data nodes which are driven to opposite data states, said nonvolatile memory circuit receiving data through first and second bit lines and having one of said data states as a predetermined default state,
a first transistor having a floating gate and having the source terminal thereof connected to said second power terminal,
a first current tunneling element connected between said floating gate and said second power terminal,
a second current tunneling element connected between said floating gate and a first node which receives a store command signal,
a first capacitor connected between said floating gate and a second node,
a second transistor having the gate terminal thereof connected to said first data node, the source terminal thereof connected to said second power terminal and the drain terminal thereof connected to said second node,
a third transistor having the drain and source terminals thereof connected between said first node and said second node,
a second capacitor connected between said first node and the gate terminal of said third transistor,
a fourth transistor having the source terminal thereof connected to the drain terminal of said first transistor, the drain terminal thereof connected to said second data node and the gate terminal thereof connected to receive a recall command signal, and
a fifth transistor having the source and drain terminals thereof connected between said second data node and the gate terminal of said third transistor and having the gate terminal thereof connected to one of said bit lines.

30. A method for nonvolatile data storage operating in conjunction with a volatile memory storage circuit, comprising the steps of:
storing a first or a second data state in said volatile memory storage circuit,
receiving a store command signal at a first node,
gating said store command signal through a transistor to a second node when said volatile memory storage circuit is in said second data state,
coupling said store command signal from said second node through a capacitor to a charge storage node for charging said charge storage node to a predetermined charge state, and
driving said volatile memory storage circuit to a selected one of said data states upon receipt of a recall command signal when said charge storage node has been charged to said predetermined charge state.

31. A method for nonvolatile data storage as recited in claim 30 wherein the step of gating said store command signal comprises precharging the gate terminal of said transistor by coupling a data node of said volatile memory storage circuit to said gate terminal of said transistor through a second transistor which is rendered conductive by an activation signal.

32. A method for nonvolatile data storage as recited in claim 30 wherein the step of coupling said store command signal to a charge storage node for charging said charge storage node comprises driving said charge storage node to a sufficient voltage state to cause current tunneling between said charge storage node to a fixed voltage node.

33. A method for nonvolatile data storage as recited in claim 30 wherein the step of driving said volatile memory storage circuit to a selected one of said data states comprises coupling a transistor that is controlled by the charge state of said charge storage node to a data node of said volatile memory storage circuit.

34. A method for nonvolatile data storage operating in conjunction with a volatile memory storage circuit, comprising the steps of:
storing a first or a second data state in said volatile memory storage circuit,
receiving a store command signal at a first node,
gating said store command signal to a second node when said volatile memory storage circuit is in said second data state,
coupling said store command signal from said second node through a capacitor to a charge storage node for charging said charge storage node to a first charge state,
clamping said second node to a fixed voltage state when said volatile memory storage circuit is in said first data state,
charging said charge storage node to a second charge state when said second node is clamped to said fixed voltage state and said store command signal is received at said first node,
driving said volatile memory storage circuit to a predetermined one of said data states upon receipt of a recall command signal when said charge storage node is charged to a predetermined one of said charge states, and
driving said volatile memory storage circuit to other than said predetermined one of said data states when power is applied to said volatile memory storage circuit and said charge storage node is charged to other than said predetermined one of said charge states.

35. A method for nonvolatile data storage as recited in claim 34 wherein the step of gating said store command signal to a second node comprises precharging the gate terminal of a first transistor by coupling thereto a data node of said volatile memory storage circuit through a second transistor which is rendered conductive by an activation signal, said first transistor having the source and drain terminals thereof connected between said first node and said second node.

36. A method for nonvolatile data storage as recited in claim 34 wherein said step of driving said volatile memory storage circuit to a predetermined one of said data states comprises applying said recall command signal to the gate terminal of a first transistor to render the first transistor conductive to couple a second transistor wherein the gate terminal thereof comprises said charge storage node to a data node of said volatile memory storage circuit to set said volatile memory storage circuit to said predetermined one of said data states.

37. A method for nonvolatile data storage comprising the steps of:

driving first and second data nodes of a volatile memory circuit to opposite first and second data states, charging a floating gate of a first transistor to a first charge state by applying a store command signal across a first current tunneling element connected between a third node and said floating gate when said volatile memory circuit is in said first data state, charging said floating gate to a second charge state by gating said store command signal through a transistor and capacitor to said floating gate for applying a voltage across a second current tunneling element connected between said floating gate and a power terminal when said volatile memory circuit is in said second data state, and driving said volatile memory circuit to a selected one of said data states upon receipt of a recall signal at the gate terminal of a second transistor connected in series with said first transistor between one of said data nodes and a power terminal of said memory cell when said first transistor is rendered conductive by the charge on the floating gate thereof.

* * * * *